(12) United States Patent
Hawley et al.

(10) Patent No.: US 6,965,156 B1
(45) Date of Patent: Nov. 15, 2005

(54) AMORPHOUS CARBON METAL-TO-METAL ANTIFUSE WITH ADHESION PROMOTING LAYERS

(75) Inventors: Frank W. Hawley, Campbell, CA (US); A. Farid Issaq, Campbell, CA (US); John L. McCollum, Saratoga, CA (US); Shubhra M. Gangopadhyay, Lubbock, TX (US); Jorge A. Lubguban, Lubbock, TX (US); Jin Miao Shen, Austin, TX (US)

(73) Assignees: Actel Corporation, Mountain View, CA (US); Texas Tech University System, Lubbock, TX (US)

( * ) Notice: Subject to any disclaimer, the term of this patent is extended or adjusted under 35 U.S.C. 154(b) by 0 days.

(21) Appl. No.: 10/331,144

(22) Filed: Dec. 27, 2002

(51) Int. Cl.⁷ .............................................. H01L 29/00
(52) U.S. Cl. ...................... 257/530; 257/50; 257/209; 257/200; 257/903; 257/76; 438/131; 438/667; 438/600
(58) Field of Search ............................ 257/530, 50, 76, 257/529, 528, 531, 51, 52, 55, 77, 209, 200, 257/901, 26; 438/131, 667, 600

(56) References Cited

U.S. PATENT DOCUMENTS

| | | | |
|---|---|---|---|
| 4,442,507 A | 4/1984 | Roesner | 365/100 |
| 4,543,594 A | 9/1985 | Mohsen et al. | 357/51 |
| 4,823,181 A | 4/1989 | Mohsen et al. | 357/51 |
| 4,881,114 A | 11/1989 | Mohsen et al. | 357/54 |
| 4,899,205 A | 2/1990 | Hamdy et al. | 357/51 |
| 5,070,384 A | 12/1991 | McCollum et al. | 357/51 |
| 5,171,715 A | 12/1992 | Husher et al. | 437/195 |
| 5,181,096 A | 1/1993 | Forouhi | 257/530 |
| 5,196,724 A | 3/1993 | Gordon et al. | 257/530 |
| 5,272,101 A | 12/1993 | Forouhi et al. | 437/50 |
| 5,308,795 A | 5/1994 | Hawley et al. | 437/195 |
| 5,365,104 A | 11/1994 | Godinho et al. | 257/529 |
| 5,411,917 A | 5/1995 | Forouhi et al. | 437/195 |
| 5,576,576 A | 11/1996 | Hawley et al. | 257/530 |
| 5,592,016 A | 1/1997 | Go et al. | 257/530 |
| 5,763,898 A | 6/1998 | Forouhi et al. | 257/50 |
| 5,780,323 A | 7/1998 | Forouhi et al. | 438/131 |
| 5,789,764 A * | 8/1998 | McCollum | 257/76 |
| 5,965,270 A * | 10/1999 | Fang et al. | 428/446 |
| 6,114,714 A * | 9/2000 | Gangopadhyay | 257/50 |
| 6,316,346 B1 * | 11/2001 | Gangopadhyay | 438/600 |
| 6,437,365 B1 | 8/2002 | Hawley et al. | 257/50 |
| 2002/0100907 A1 | 8/2002 | Wang | 257/50 |
| 2003/0062596 A1 * | 4/2003 | Hawley et al. | 257/530 |

FOREIGN PATENT DOCUMENTS

| | | | | |
|---|---|---|---|---|
| EP | 0 250 078 A2 | 12/1987 | | H01L 23/52 |
| EP | 0 671 767 A2 | 9/1995 | | H01L 23/525 |

(Continued)

*Primary Examiner*—Nathan J. Flynn
*Assistant Examiner*—Fazli Erdem
(74) *Attorney, Agent, or Firm*—Sierra Patent Group, Ltd.

(57) ABSTRACT

A metal-to-metal antifuse having a lower metal electrode, a lower thin adhesion promoting layer disposed over the lower metal electrode, an amorphous carbon antifuse material layer disposed over the thin adhesion promoting layer, an upper thin adhesion promoting layer disposed over said antifuse material layer, and an upper metal electrode. The thin adhesion promoting layers are about 2 angstroms to 20 angstroms in thickness, and are from a material selected from the group comprising $Si_xC_y$ and $Si_xN_y$. The ratio of x to y in $Si_xC_y$ is in a range of about 1+/−0.4, and the ratio of x to y in $Si_xN_y$ is in a range of about 0.75+/−0.225.

34 Claims, 3 Drawing Sheets

FOREIGN PATENT DOCUMENTS

| | | | | |
|---|---|---|---|---|
| EP | 0 671 767 A3 | 1/1998 | ......... | H01L 23/525 |
| JP | 60-242678 A | 12/1985 | ........... | H01L 29/78 |
| JP | 60-295991 A | 10/1994 | ........... | H01L 27/10 |
| WO | WO 92/21154 | 11/1992 | ........... | H01L 45/00 |

* cited by examiner

AMORPHOUS CARBON METAL-TO-METAL ANTIFUSE WITH ADHESION PROMOTING LAYERS

BACKGROUND OF THE INVENTION

1. Field of the Invention

The present invention relates to amorphous carbon metal-to-metal antifuse structures. More particularly, the present invention relates to amorphous carbon metal-to-metal antifuse structures employing adhesion layers for preventing amorphous carbon thin film peeling.

2. The Background Art

Integrated electronic circuits are typically fabricated with all internal connections set during the manufacturing process. However, because of high development costs and high manufacturing tooling costs of such circuits, it is advantageous for integrated circuits to be configured or programmed by the user to implement a desired application. Such circuits are called programmable circuits, and antifuses are known in the art for providing the programmability of these circuits. Antifuses are devices which generally comprise a pair of conductive electrodes sandwiched about an insulating antifuse material layer.

A programming process disrupts the antifuse material and forms a filament between the two electrodes. Prior to programming, antifuses exhibit a resistance of a few gigaohms between the two electrodes and may be considered to be open circuits. The programming process creates a low-impedance connection of a few ohms to a few thousand ohms between the two electrodes. Programming voltages range from a few volts to about 20 volts.

It is known in the art that antifuses have been fabricated where the electrodes have been selected from a number of different electrically conductive layer materials, and the antifuse material layer has been fabricated from a number of different insulating materials. It is also known that many different antifuse structures have been proposed, including, "via" type, half-stacks, full stacks, conductive plugs and numerous other variations.

Antifuses are generally classified into two categories. A first type of antifuse, referred to as a substrate antifuse, has a doped region in a semiconductor substrate as its lower electrode and a layer of metal or doped polysilicon as its upper electrode. The antifuse material typically comprises one or more layers of silicon nitride or silicon dioxide. An example of such an antifuse is made of an oxide-nitride-oxide (ONO) antifuse material layer sandwiched between an N+ diffusion layer and a polysilicon ("Poly") layer (N+/ONO/Poly). Such a device is described in detail in U.S. Pat. Nos. 4,823,181 and 4,881,114. For this category of antifuse, contacts have to be made to the N+ diffusion layer and the upper electrode from two corresponding conductive metal lines.

There are known problems with substrate level antifuses. Some of the suggested dielectric materials require complex manufacturing techniques and have low reliability during programming. Some programmed antifuses may have a finite resistance on the order of several hundred to several thousand ohms which may render them relatively unsuitable for use in high speed circuits, and also result in high power consumption when a large number of circuits are switching simultaneously. Further, to maintain reliable operation at commercially acceptable voltages, proposed antifuse material layers are typically thin enough to produce a relatively high capacitance. This can place a limit on device operating speed because antifuses on a single line act as capacitors linked in parallel, such that the sum of the individual capacitances of the unprogrammed antifuses can slow data signals undesirably. Finally, substrate antifuses consume a lot of chip area.

A second type of antifuse, referred to as a metal-to-metal antifuse has a first metal layer disposed above and insulated from a semiconductor substrate as its lower electrode, a second metal layer as its upper electrode, and an antifuse material layer sandwiched between the first and second layers of metal. The antifuse material layer may be accompanied by one or more barrier metal layers separating it from lower and upper metal interconnect layers. Numerous structures for metal-to-metal antifuses are known in the art. Illustrative and non-exhaustive examples of metal-to-metal antifuses are shown in U.S. Pat. No. 5,272,101 to Forouhi et al.

The resistance of a programmed metal-to-metal antifuse is typically much lower than a programmed substrate level antifuse. During programming of a metal-to-metal antifuse, the metallization layers in the vicinity of the antifuse, the antifuse material layer and a portion of the adjacent metallization layers will disrupt and/or melt, and a conductive link will form through the antifuse material layer due to metal from the adjacent metallization layer being drawn in and intermixed through mass transport and thermal driven material diffusion and chemical reaction.

Metal-to-metal antifuses usually employ a layer of amorphous silicon as the antifuse material, however, they may also employ oxide and nitride layers either alone or in multilayer combinations, or in combinations with amorphous silicon. Examples of antifuses that have been suggested using one or more oxide or nitride layers as antifuse material layers include U.S. Pat. No. 4,543,594 to Mohsen et al., U.S. Pat. No. 4,823,181 to Mohsen et al., U.S. Pat. No. 4,899,205 to Hamdy et al. Examples of antifuses that have been suggested using amorphous silicon as an antifuse material layer, either by itself, or in combination with one or more oxide or nitride layers include U.S. Pat. No. 5,070,384 to McCollum et al., U.S. Pat. No. 5,171,715 to Husher et al., and U.S. Pat. No. 5,181,096 to Forouhi et al., U.S. Pat. No. 5,272,101 to Forouhi et al., and U.S. Pat. No. 5,196,724 to Gordon.

Antifuse capacitance, as described above, is also a problem for metal-to-metal antifuses. Amorphous silicon antifuses alleviate this problem by providing a relatively thick antifuse layer, however, amorphous silicon antifuses exhibit relatively high leakage currents. Another approach has been to form a leakage barrier between the electrodes and the amorphous silicon antifuse material. A thin layer of deposited silicon dioxide or silicon nitride has been used. If this layer is too thin, it will not be an effective barrier, and if it is too thick, it will appreciably raise the programming voltage of the antifuse.

It is known that metal-to-metal antifuses will exhibit under specific conditions where excessive current is placed across a programmed antifuse a phenomenon wherein the conductive links will open up or become non-conductive. This failure mode is commonly known as "read disturb" because the excessive parasitic current occurs during the read state of the antifuse.

One factor which contributes to read disturb is the presence of any significant quantity of aluminum in the antifuse conductive links due to electromigration of the aluminum. Metal Barrier layers which serve to block aluminum flow into the antifuse material layer of various materials and various thicknesses have been proposed. The barrier materials, between the aluminum and the amorphous silicon, provide essentially all of the conductive material forming the conductive filament in the programmed antifuse. An antifuse formed with such a barrier metal link material can tolerate more current and have a higher reliability than an antifuse formed without the barrier metal link material.

Another way to overcome this problem is to change the composition of the antifuse material. For example, an amorphous silicon antifuse layer may be replaced with another low-temperature dielectric, such as oxide, nitride, or combinations of oxide and nitride have lower leakage current and higher breakdown voltage. Therefore, to maintain the same breakdown voltage requirements, the thickness of the antifuse dielectric has to be reduced. However, reducing the thickness of the antifuse material layer results in an increase in the capacitance of the antifuse in its unprogrammed state. This increased capacitance has a negative impact on the product speed.

Other materials which are harder and denser than amorphous silicon, such as silicon carbide (SiC) and amorphous carbon (a-C) have been proposed to replace amorphous silicon to reduce the read disturb phenomenon and other problems associated with amorphous silicon metal-to-metal antifuses. It is important to employ these materials at desired programming voltages, and with a minimum of capacitance.

Amorphous carbon has been shown to significantly address the read disturb phenomenon. One problem in employing a-C as the antifuse material layer has been that it can fail to adhere to a metal electrode. Adhesion of the layers in a thin film device typically occurs because there is either ionic bonding at the interface of the films, metallurgical bonding where a chemical reaction between the materials results in a new material, or mechanical adhesion where the adhesion is due to the deposited film hooking onto surface nooks and projections.

When materials in a thin film device do not adhere to one another, a "glue" layer must be employed. In an a-C based antifuse device, the problem of finding a material layer glue is difficult because a suitable material layer must adhere to both the metal electrode and the a-C. Concurrently, the adhesion material of the glue layer employed should have minimal impact on the programming and capacitance characteristics of the antifuse.

BRIEF DESCRIPTION OF THE INVENTION

According to the present invention an antifuse is disposed above a semiconductor substrate with an intervening insulating layer. The antifuse has a lower electrode, a lower adhesion layer, an antifuse material layer, an upper adhesion layer, and an upper electrode. The antifuse material layer is preferably amorphous carbon (a-C), and the lower and upper adhesion layers are employed to adhere the a-C antifuse material layer to the lower and upper electrodes, respectively.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
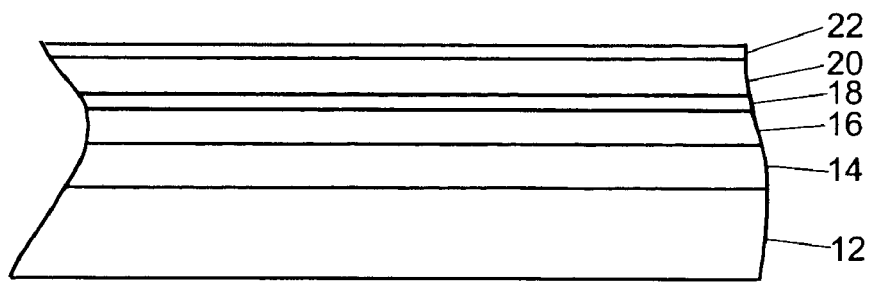
FIG. 1 illustrates schematically in a cross-sectional view an antifuse according to the present invention.

In FIG. 1, an antifuse 10 according to the present invention is depicted schematically in a cross-sectional view. The antifuse 10 is disposed above a semiconductor substrate 12 with an intervening insulating layer 14. The antifuse 10 has a lower electrode 16, a thin lower adhesion layer 18, an antifuse material layer 20, a thin upper adhesion layer 22, and an upper electrode 24. According to the present invention, the antifuse material layer 20 is preferably amorphous carbon (a-C), and the lower and upper adhesion layers 18 and 22, respectively, are employed to adhere the a-C antifuse material layer 20 to the lower and upper electrodes 16 and 24, respectively.

It should be appreciated that when an additional layer, such as a barrier layer, is disposed over the lower electrode 16 or subjacent the upper electrode 24, the lower or upper adhesion layer 18 and 22, respectively, will adhere the a-C antifuse material layer 20 to the layer disposed over the lower electrode 16 or subjacent the upper electrode 24, respectively that is at the interface with the a-C antifuse material layer 20.

According to the present invention, the adhesion layers 18 and 22 should minimize the capacitance and do little to degrade the switching performance of the antifuse 10. The material for the adhesion layers 18 and 22 is preferably silicon carbide ($Si_xC_y$) where the ratio of x to y is 1.0+/−0.4. Depending on the ratio of x to y, the dielectric constant of the SiC layer will be the range of about 4 to about 6. The adhesion layers 18 and 22 should not substantially affect the electrical characteristics of antifuse 10 controlled by the antifuse material layer 20, such that the breakdown voltage, capacitance or leakage of the antifuse may not change by more than about ten percent, and are preferably quite thin.

As such, the adhesion layers 18 and 22 may be between one and a few atoms thick giving a thickness for the adhesion layers 18 and 22 a range of about 2 angstroms to about 20 angstroms. It should be appreciated that a material layer of 2 angstroms represents an average material layer thickness. For example, in a sparsely dense atomic monolayer there may be sufficient space between the individual atoms of the monolayer that a measured thickness will give an average thickness of the sparsely spaced atoms. The SiC may be deposited using PECVD techniques well known to those of ordinary skill in the art.

In determining the capacitance of the antifuse 10, the capacitance of the tri-layer structure, which includes adhesion layer 18, antifuse material layer 20, and adhesion layer 22, is the total series of the capacitance of layers 18, 20 and 22. A tri-layer structure including a 2 angstrom layer of SiC, a 100 angstrom layer of a-C having a dielectric constant of about 2.5 to about 4, and a 2 angstrom layer of SiC, will have a dielectric constant of about 4, and a tri-layer structure including a 20 angstrom layer of SiC, a 100 angstrom layer of a-C, and a 20 angstrom layer of SiC will have a dielectric constant of about 5.5.

Silicon nitride ($Si_xN_y$) where the ratio of x to y is 0.75+/−0.225 may also be employed as the adhesion layers 18 and 22 according to the present invention. The SiN may be deposited using PECVD techniques well known to those of ordinary skill in the art. The dielectric constant of the SiN layer will be in the range of about 6 to about 8, so that the dielectric constant for a tri-layer structure of SiN/a-C/SiN with material layer thicknesses comparable to the material layer thicknesses of the tri-layer structure of SiC/a-C/SiC described above will be higher than the dielectric constant for the SiC/a-C/SiC tri-layer structure.

Silicon Carbide Nitride ($Si_xC_yN_z$) where the ratio of x to y to z is (1:1:1)+/−0.40 for any ratio may also be employed as the adhesion layers 18 and 22 according to the present invention. The SiCN may be deposited using PECVD techniques well known to those of ordinary skill in the art. The dielectric constant of the SiCN layer will be in the range of about 4 to about 8, so that the dielectric constant for a tri-layer structure of SiCN/a-C/SiCN with material layer thicknesses comparable to the material layer thicknesses of the tri-layer structure of SiC/a-C/SiC described above will be higher than the dielectric constant for the SiC/a-C/SiC tri-layer structure.

Amorphous Silicon (a-Si) may also be employed as the adhesion layers 18 and 22 according to the present invention. The a-Si may be deposited using PECVD techniques well known to those of ordinary skill in the art. The dielectric constant of the a-Si layer will be in the range of about 11 to about 12, so that the dielectric constant for a tri-layer structure of a-Si/a-C/a-Si with material layer thicknesses comparable to the material layer thicknesses of the tri-layer structure of SiC/a-C/SiC described above will be higher than the dielectric constant for the SiC/a-C/SiC tri-layer structure.

The antifuse material layer 20 may be formed from amorphous carbon or amorphous carbon doped with hydrogen. The use of amorphous carbon or amorphous carbon doped with hydrogen as the antifuse material layer in metal-to-metal antifuses inhibits the "healing" or "switching" by which the conductive filament deteriorates after programming.

The thickness of antifuse material layer 20 has a range of about 50 angstroms to about 500 angstroms for a breakdown voltage of about 3V to about 20V. Preferably, the thickness of the antifuse material layer 20 is about 100 angstroms for a breakdown of 5 volts. When the antifuse material layer 20 is formed from amorphous carbon doped with hydrogen, the hydrogen doping should be from about 1 atomic percent to about 40 atomic percent. The amorphous carbon, and combinations thereof, may be disposed by a source gas, preferably acetylene gas ($C_2H_2$).

Figure 2A:
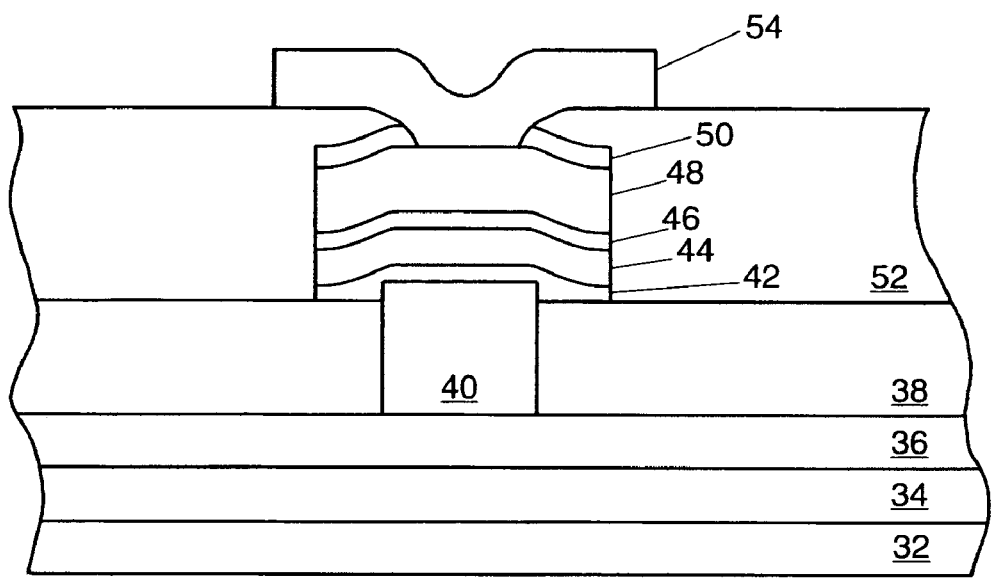
FIG. 2A illustrates in a cross-sectional view a first embodiment of a metal-to-metal antifuse structure employing the tri-layer thin adhesion layer/a-C/thin adhesion layer structure according to the present invention.
Figure 2B:
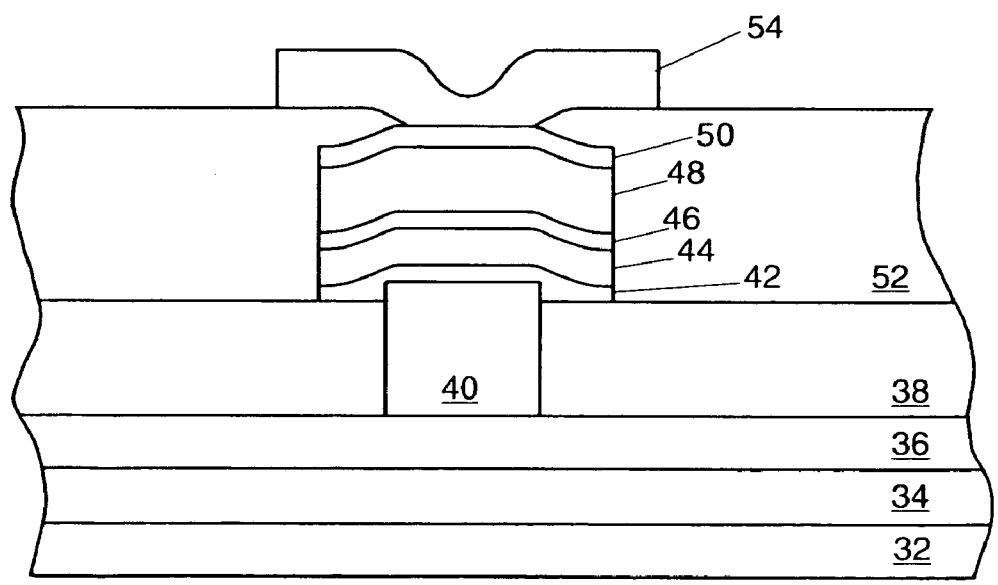
FIG. 2B illustrates in a cross-sectional view a second embodiment of a metal-to-metal antifuse structure employing the tri-layer thin adhesion layer/a-C/thin adhesion layer structure according to the present invention.

FIGS. 2A and 2B illustrates in cross-section an embodiment of a metal-to-metal antifuse structure 30 employing the tri-layer structure discussed above including a thin adhesion layer/a-C/thin adhesion layer according to the present invention. In the embodiment shown in FIGS. 2A and 2B, substrate 32 is covered by an insulating layer 34 and a metal interconnect layer 36. Persons of ordinary skill in the art will realize FIGS. 2A and 2B are merely illustrative and that metal interconnect layer 36 need not be the first metal interconnect layer in a multi-level integrated circuit.

Insulating layer 38, formed from, for example, deposited silicon dioxide having a thickness from between about 400 nanometers (nm) to about 1000 nm, is disposed above metal interconnect layer 36 and includes a tungsten (W) plug 40 formed in a via therethrough and electrically coupled to metal interconnect layer 36. As is known in the art, the upper surfaces of insulating layer 38 and W plug 40 may be plannarized to provide a relatively flat surface upon which to fabricate antifuse 30. Alternatively, W plug 40 may be raised above the surface of the surface of the insulating layer 38 by performing planarization using chemical/mechanical polishing (CMP) techniques or by performing a plasma oxide etch after planarization.

W plug 40 forms the lower electrode of antifuse 30. Though not depicted in FIGS. 2A and 2B, a barrier metal layer such as Ta, TaN, TaC, Ti, TiC, W, WN or TiN having a thickness of about 25 nm to about 200 nm may be disposed over the W plug 40 forming the lower electrode of antifuse 30. To avoid overcomplicating the disclosure and thereby obscuring the present invention, embodiments employing a barrier layer over the lower electrode of antifuse 30 are not described in detail herein.

An implementation of such an embodiment suitable for use according to the present invention is disclosed in U.S. patent application Ser. No. 09/972,825, filed Oct. 2, 2001 by inventors Frank Hawley, John McCollum, and Jeewika Ranaweera, entitled "METAL-TO-METAL ANTIFUSE EMPLOYING CARBON CONTAINING ANTIFUSE MATERIAL", and hereby incorporated by reference.

According to the present invention, a thin lower adhesion promoting layer 42 of either SiC, SiN, SiCN or a-Si having a thickness of about 2 angstroms to about 20 angstroms, or other suitable adhesion layer, as described above, is disposed over the lower antifuse electrode formed by the tungsten plug 40. An antifuse material layer 44 of a-C or a-C doped with hydrogen and having a thickness of about 2.5 nm to about 1000 nm is disposed over the lower adhesion promoting layer 42. A thin upper adhesion promoting layer 46 of either SiC, SiN, SiCN or a-Si having a thickness of about 2 angstroms to about 20 angstroms, or other suitable adhesion layer, as described above, is disposed over antifuse material layer 44.

A barrier metal layer 48 forming an upper antifuse electrode such as Ta, TaN, TaC, Ti, TiC, W, WN or TiN having a thickness of about 25 nm to about 200 nm is disposed over the adhesion promoting layer 46. A hard mask layer 50 is deposited over barrier metal layer 48. In FIG. 2A, the hardmask layer is formed by oxide, and in FIG. 2B, the hardmask layer is formed by W. In both FIGS. 2A and 2B, an insulating layer 52 of deposited silicon dioxide having a thickness of about 100 nm to about 200 nm is formed over the structure including lower adhesion promoting layer 42, antifuse material layer 44, upper adhesion promoting layer 46, and barrier metal layer 48. In FIG. 2A, metal interconnect layer 54 is disposed over the insulating layer 52 and contacts barrier metal layer 48 by a via formed through hardmask oxide layer 50 and insulating layer 52. In FIG. 2B, metal interconnect layer 54 is disposed over the insulating layer 52 and contacts hardmask W layer 50 by a via formed through insulating layer 52.

The hardmask layer 50 is patterned and etched to form a hard mask that will act as an etch mask when etching barrier metal layer 48, upper adhesion promoting layer 46, antifuse material layer 44, and lower adhesion promoting layer 42 to form an antifuse "stack". When oxide is employed as hardmask layer 50, the oxide layer protects the antifuse material layer 44 from being removed during a photoresist stripping step. Alternatively, since Al, Ti, Ta, TaN, and TiN have high selectivity to W, a thin layer of PVD W in a range of about 25 nm to about 50 nm can also be employed as the hard mask layer 50 to etch the barrier metal layer 48. The oxide or W hardmask provides high etch selectivity and ability to etch metals without affecting the dielectric constant and the mechanical properties of the a-C antifuse material layer 44.

Figure 3A:
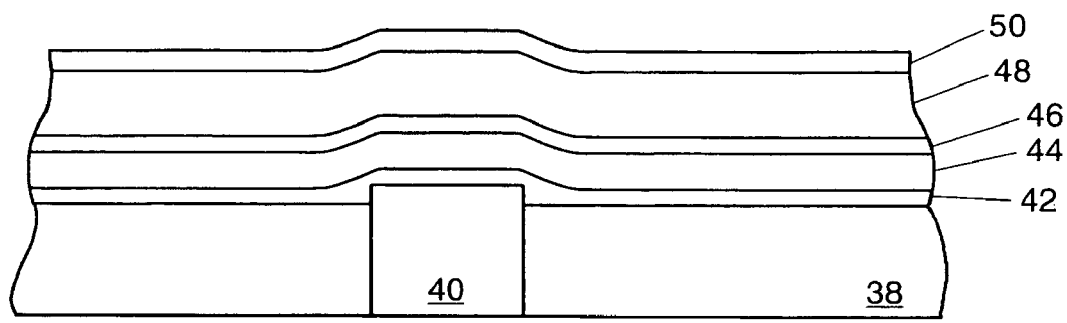
FIGS. 3A through 3F are cross-sectional views of the antifuses of FIGS. 2A and 2B showing the structures existing at selected points in the fabrication process according to the present invention.
Figure 3B:
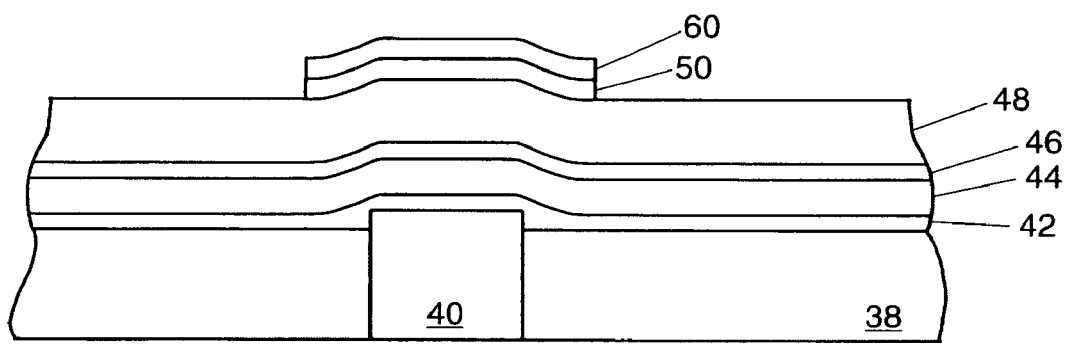
Figure 3C:
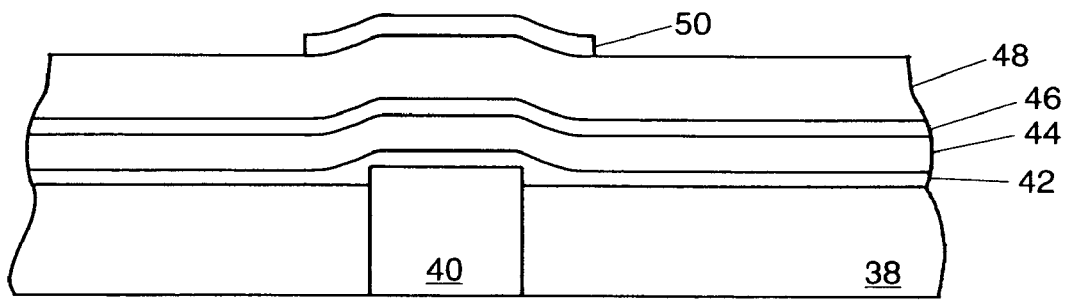

FIGS. 3A through 3D are cross-sectional views of the antifuses of FIGS. 2A and 2B showing the structure existing at selected points in the fabrication process. Since the fabrication of antifuse 30 begins after the planarization of insulating layer 38 and W plug 40 that follows well-known prior processing steps, all of FIGS. 3A through 3C show the insulating layer 38 and the W plug 40 as the starting point for the fabrication process.

In FIG. 3A, antifuse 30 of FIGS. 2A and 2B is fabricated by forming a lower adhesion promoting layer 42 over W plug 40 and insulating layer 38. The adhesion promoting layer 42 should be quite thin to minimize the effects on electrical characteristics of the antifuse material layer 44. As such, the adhesion promoting layer 42 may be between one and a few atoms thick giving a thickness for the adhesion layer 42 a range of about 2 angstroms to about 20 angstroms. When either SiC, SiN, SiCN or a-Si are employed as the material of adhesion promoting layer 42, either of the SiC, SiN, SiCN or a-Si may be deposited using PECVD techniques well known to those of ordinary skill in the art.

An antifuse material layer 44 of a-C or hydrogen doped a-C is then deposited on adhesion promoting layer 42 in a layer having a thickness in a range of about 50 angstroms to about 500 angstroms using PECVD techniques well known to those of ordinary skill in the art. It will be appreciated by those of ordinary skill in the art that the thickness of the antifuse material layer employed will depend on the desired programming voltage for the finished antifuse 30.

An upper adhesion promoting layer 46 is deposited over a-C antifuse material layer 44. The adhesion promoting layer 46 should be quite thin to minimize the effects on electrical characteristics of the antifuse material layer 44. As such, the adhesion promoting layer 46 may be between one and a few atoms thick giving a thickness for the adhesion layer 46 a range of about 2 angstroms to about 20 angstroms. When either SiC, SiN, SiCN or a-Si are employed as the material of adhesion promoting layer 46, either the SiC, SiN, SiCN or a-Si are deposited using PECVD techniques well known to those of ordinary skill in the art.

In one embodiment, barrier layer 48 is deposited to a thickness of about 25 nm to about 200 nm using PVD sputtering techniques well known to those of ordinary skill in the art. Hardmask layer 50 is then deposited over barrier metal layer 48. When the hardmask layer 50 is oxide, the hardmask layer 50 is deposited at about 50 nm to about 400 nm, with about 200 nm preferred, using, for example, PECVD techniques well known to those of ordinary skill in the art. When the hardmask layer 50 is W, the hardmask layer 50 is deposited at about 25 nm to about 50 nm using PVD sputtering techniques well known to those of ordinary skill in the art.

Figure 3D:
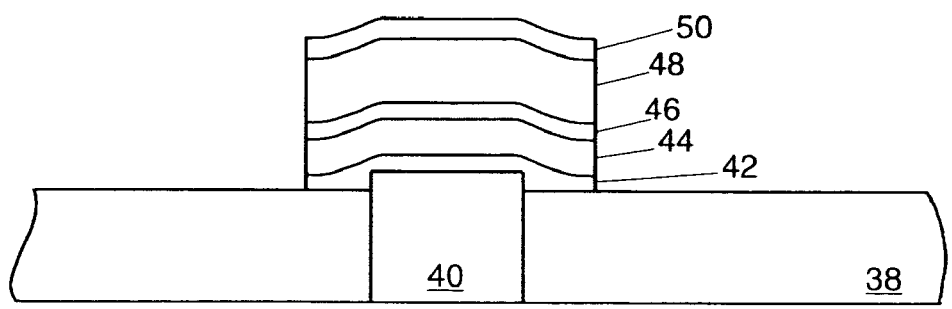

In FIG. 3B, a layer of photoresist 60 has been deposited and patterned on the hardmask layer 50, and hardmask 50 is shown as etched. As depicted in FIG. 3C, following etching, the photoresist is stripped and the remaining hardmask layer 50 is left to act as an etch mask when etching lower adhesion promoting layer 42, antifuse material layer 44, upper adhesion promoting layer 46, and barrier metal layer 48 to form the antifuse stack depicted in FIG. 3D after etching. The photoresist deposition, etch and strip steps of FIGS. 3B and 3C, and the etching step of FIG. 3D are performed using conventional processing techniques.

Figure 3E:
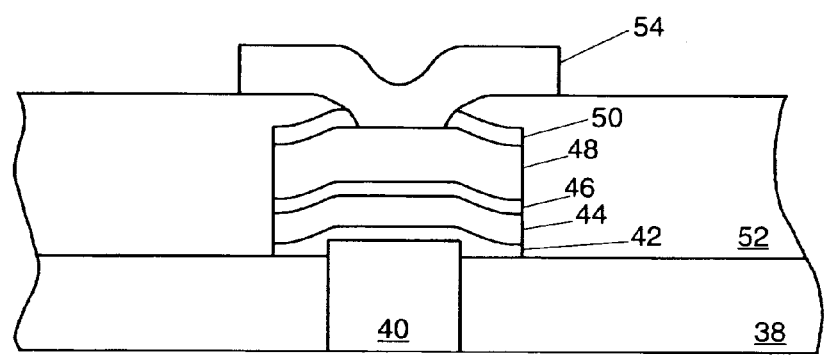
Figure 3F:
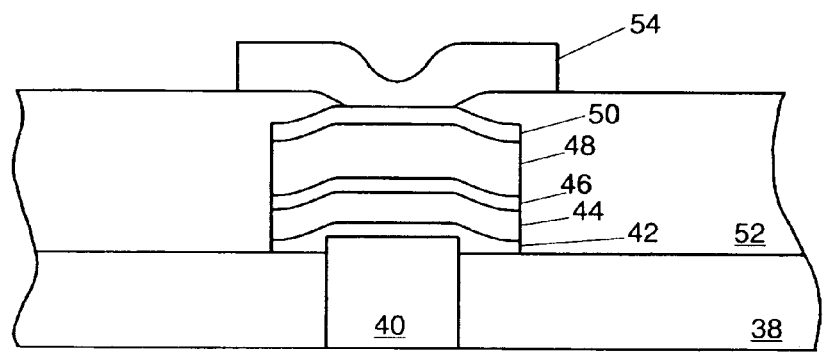

In FIGS. 3E and 3F, an insulating layer 52 of silicon dioxide having a thickness of about 100 nm to about 200 nm is deposited using, for example, PECVD techniques well known to those of ordinary skill in the art over the structure including lower adhesion promoting layer 42, antifuse material layer 44, upper adhesion promoting layer 46, barrier metal layer 48, and hardmask layer 50. In FIG. 3E, metal interconnect layer 54 is disposed over the insulating layer 52 and contacts barrier metal layer 48 by a via formed through hardmask oxide layer 50 and insulating layer 52. In FIG. 3F, metal interconnect layer 54 is disposed over the insulating layer 52 and contacts hardmask W layer 50 by a via formed through insulating layer 52. The metal interconnect layer 54 may be formed using PVD sputtering. The vias are formed in FIGS. 3E and 3F using conventional processing techniques.

The adhesion layers should minimize the capacitance of and do little to degrade the switching performance of the antifuse. The adhesion layers may be quite thin in a range of about 2 angstroms to about 20 angstroms to minimize the effects on electrical characteristics of the antifuse material layer. The material for the adhesion layers is preferably silicon carbide ($Si_xC_y$). Depending on the ratio of x to y, the dielectric constant of the SiC layer will be the range of about 4 to about 6. Silicon nitride ($Si_xN_y$) may also be employed as the adhesion layers according to the present invention. Depending on the ratio of x to y, the dielectric constant of the SiN layer will be the range of about 6 to about 8. Silicon Carbide Nitride ($Si_xC_yN_z$) where the ratio of x to y to z is (1:1:1)+/−0.40 for any ratio may also be employed as the adhesion layers. The dielectric constant of the SiCN layer will be in the range of about 4 to about 8. Amorphous Silicon (a-Si) may also be employed as the adhesion layers. The dielectric constant of the a-Si layer will be in the range of about 11 to about 12. The SiC, SiN, SiCN and a-Si are deposited using PECVD techniques well known to those of ordinary skill in the art.

For an antifuse material layer of a-C having a dielectric constant of about 2.5 to about 4, a tri-layer structure including a 2 angstrom layer of SiC, a 100 angstrom layer of a-C, and a 2 angstrom layer of SiC, will have a dielectric constant of about 4, and a tri-layer structure including a 20 angstrom layer of SiC, a 100 angstrom layer of a-C, and a 20 angstrom layer of SiC, will have a dielectric constant of about 5.5. The dielectric constant for a tri-layer structure of SiN/a-C/SiN with material layer thicknesses comparable to the material layer thicknesses of the tri-layer structure of SiC/a-C/SiC will be higher than the dielectric constant for the SiC/a-C/SiC tri-layer structure.

While the invention has been described with reference to an exemplary embodiment, it will be understood by those skilled in the art that various changes may be made and equivalents may be substituted for elements thereof without departing from the scope of the invention. For example, it is to be understood that oxygen may be included in the mixture of any materials disclosed for the adhesion layers, for example, in addition to SiC and SiN; SiOC and SiON may be used, as well as similar mixtures of the other materials disclosed. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A metal-to-metal antifuse comprising:
   a lower metal electrode;
   a lower adhesion promoting layer disposed over said lower metal electrode, said lower adhesion promoting layer being without substantial affect on electrical characteristics of the antifuse;
   an amorphous carbon antifuse material layer disposed over said lower adhesion promoting layer;
   an upper adhesion promoting layer disposed over said antifuse material layer, said upper adhesion promoting layer being without substantial affect on electrical characteristics of the antifuse; and
   an upper metal electrode disposed over said upper adhesion promoting layer,
   wherein said lower adhesion promoting layer and said upper adhesion promoting layer are selected from a group of materials comprising $Si_xC_y$, having a ratio of x to y of about 1+/−0.4, and $Si_xN_y$.

2. The metal-to-metal antifuse in claim 1, wherein said lower adhesion promoting layer is about 2 angstroms to about 20 angstroms in thickness and said upper adhesion promoting is about 2 angstroms to about 20 angstroms in thickness.

3. The metal-to-metal antifuse in claim 1, wherein said $Si_xC_y$ has a dielectric constant of about 4 to about 6.

4. The metal-to-metal antifuse in claim 1, wherein a ratio of x to y in said $Si_xN_y$ is about 0.75+/−0.225.

5. The metal-to-metal antifuse in claim 1, wherein said $Si_xN_y$ has a dielectric constant of about 6 to about 8.

6. The metal-to-metal antifuse in claim 2, wherein said $Si_xC_y$ has a dielectric constant of about 4 to about 6.

7. The metal-to-metal antifuse in claim 2, wherein a ratio of x to y in said $Si_xN_y$ is about 0.75+/−0.225.

8. The metal-to-metal antifuse in claim 2, wherein said $Si_xN_y$ has a dielectric constant of about 6 to about 8.

9. The metal-to-metal antifuse in claim 1, wherein said amorphous carbon antifuse material layer is about 50 angstroms to about 500 angstroms in thickness.

10. The metal-to-metal antifuse in claim 1, wherein said amorphous carbon antifuse material layer has a dielectric constant of about 2.5 to about 4.

11. The metal-to-metal antifuse in claim 1, wherein said amorphous carbon antifuse material layer is doped with hydrogen in a concentration range of about 1 atomic percent to about 40 atomic percent.

12. The metal-to-metal antifuse in claim 11, wherein said amorphous carbon antifuse material layer is about 50 angstroms to about 500 angstroms in thickness.

13. The metal-to-metal antifuse in claim 11, wherein said amorphous carbon antifuse material layer has a dielectric constant of about 2.5 to about 4.

14. The metal-to-metal antifuse in claim 1, wherein said amorphous carbon antifuse material layer is about 50 angstroms to about 500 angstroms in thickness, and said lower adhesion promoting layer and said upper adhesion promoting layer are about 2 angstroms to about 20 angstroms in thickness.

15. The metal-to-metal antifuse in claim 14, wherein said $Si_xC_y$ has a dielectric constant of about 4 to about 6.

16. The metal-to-metal antifuse in claim 14, wherein a ratio of x to y in said $Si_xN_y$ is about 0.75+/−0.225.

17. The metal-to-metal antifuse in claim 14, wherein said $Si_xN_y$ has a dielectric constant of about 6 to about 8.

18. The metal-to-metal antifuse in claim 14, wherein said amorphous carbon antifuse material layer has a dielectric constant of about 2.5 to about 4.

19. The metal-to-metal antifuse in claim 14, wherein said amorphous carbon antifuse material layer is doped with hydrogen from about 1 atomic percent to about 40 atomic percent.

20. The metal-to-metal antifuse in claim 19, wherein said amorphous carbon antifuse material layer has a dielectric constant of about 2.5 to about 4.

21. The metal-to-metal antifuse in claim 1, wherein a layer comprising said lower adhesion promoting layer, said amorphous carbon antifuse material layer, and said upper adhesion promoting layer have a dielectric constant of about 4 to about 5.5.

22. A metal-to-metal antifuse comprising:
   a lower metal electrode;
   a lower adhesion promoting layer disposed over said lower metal electrode, said lower adhesion promoting layer having a thickness of about 2 angstroms to 20 angstroms;
   an amorphous carbon antifuse material layer disposed over said lower adhesion promoting layer;
   an upper adhesion promoting layer disposed over said antifuse material layer, said upper adhesion promoting layer having a thickness of about 2 angstroms to 20 angstroms; and
   an upper metal electrode disposed over said upper adhesion promoting layer,
   wherein said lower adhesion promoting layer and said upper adhesion promoting layer are selected from a group of materials comprising $Si_xC_y$, having a ratio of x to y of about 1+/−0.4, and $Si_xN_y$.

23. The metal-to-metal antifuse in claim 22, wherein said $Si_xC_y$ has a dielectric constant of about 4 to about 6.

24. The metal-to-metal antifuse in claim 22, wherein a ratio of x to y in said $Si_xN_y$ is about 0.75+/−0.225.

25. The metal-to-metal antifuse in claim 22, wherein said $Si_xN_y$ has a dielectric constant of about 6 to about 8.

26. The metal-to-metal antifuse in claim 22, wherein said amorphous carbon antifuse material layer is about 50 angstroms to about 500 angstroms in thickness.

27. The metal-to-metal antifuse in claim 22, wherein said amorphous carbon antifuse material layer has a dielectric constant of about 2.5 to about 4.

28. The metal-to-metal antifuse in claim 22, wherein said amorphous carbon antifuse material layer is doped with hydrogen in a concentration range of about 1 atomic percent to about 40 atomic percent.

29. The metal-to-metal antifuse in claim 28, wherein said amorphous carbon antifuse material layer is about 50 angstroms to about 500 angstroms in thickness.

30. The metal-to-metal antifuse in claim 28, wherein said amorphous carbon antifuse material layer has a dielectric constant of about 2.5 to about 4.

31. The metal-to-metal antifuse in claim 22, wherein said lower adhesion promoting layer, said amorphous carbon antifuse material layer, and said upper adhesion promoting layer have a dielectric constant of about 4 to about 5.5.

32. The metal-to-metal antifuse in claim 1, wherein said lower adhesion promoting layer and said upper adhesion promoting layer are selected from a group of materials comprising $Si_xC_y$, $Si_xN_y$, $Si_xC_yN_z$, $Si_xO_yC_z$, and $Si_xO_yN_z$.

33. A metal-to-metal antifuse comprising:
   a lower metal electrode;
   a lower $Si_xC_y$ layer disposed over said lower metal electrode, said lower $Si_xC_y$ layer being without substantial affect on electrical characteristics of the antifuse;
   an amorphous carbon antifuse material layer disposed over said lower $Si_xC_y$ layer;

an upper $Si_xC_y$ layer disposed over said antifuse material layer, said upper $Si_xC_y$ layer being without substantial affect on electrical characteristics of the antifuse; and an upper metal electrode disposed over said upper $Si_xC_y$ layer, wherein said lower $Si_xC_y$ layer and said upper $Si_xC_y$ layer have a ratio of x to y of about 1+/−0.4.

34. A metal-to-metal antifuse comprising:

a lower metal electrode;

a lower $Si_xN_y$ layer disposed over said lower metal electrode, said lower $Si_xN_y$ layer being without substantial affect on electrical characteristics of the antifuse;

an amorphous carbon antifuse material layer disposed over said lower $Si_xN_y$ layer;

an upper $Si_xN_y$ layer disposed over said antifuse material layer, said upper $Si_xN_y$ layer being without substantial affect on electrical characteristics of the antifuse; and an upper metal electrode disposed over said upper $Si_xN_y$ layer, wherein said lower $Si_xN_y$ layer and said upper $Si_xN_y$ layer have a ratio of x to y of about 0.75+/−0.225.

* * * * *